United States Patent [19]
Yamazaki et al.

[11] Patent Number: 6,142,356
[45] Date of Patent: Nov. 7, 2000

[54] DIE BONDING APPARATUS

[75] Inventors: Masao Yamazaki, Nara; Terumitsu Santo, Gojo, both of Japan

[73] Assignee: Sharp Kabushiki Kaisha, Osaka, Japan

[21] Appl. No.: 09/310,341

[22] Filed: May 12, 1999

[30] Foreign Application Priority Data

May 12, 1998 [JP] Japan .................................. 10-129179
Mar. 15, 1999 [JP] Japan .................................. 11-069137

[51] Int. Cl.⁷ .............................. B23K 37/00; B23K 1/14; B23K 37/04; B23K 1/00; B23K 5/00; B23K 20/00; B23Q 15/00; B23Q 16/00
[52] U.S. Cl. .................................. 228/6.2; 228/9; 228/24; 228/44.3; 228/49.1
[58] Field of Search ..................... 228/6.2, 9, 24, 228/44.3, 44.7, 49.1, 49.5

[56] References Cited

U.S. PATENT DOCUMENTS

| | | | |
|---|---|---|---|
| 3,646,304 | 2/1972 | Dallet et al. .............................. | 219/6.5 |
| 4,257,061 | 3/1981 | Chapel, Jr. et al. ...................... | 357/69 |
| 4,749,329 | 6/1988 | Stout ....................................... | 414/627 |
| 4,804,810 | 2/1989 | Drummond et al. ................... | 219/85 G |
| 5,634,267 | 6/1997 | Farnworth et al. ....................... | 29/840 |

FOREIGN PATENT DOCUMENTS

| | | |
|---|---|---|
| 6-320430 | 2/1988 | Japan . |
| 4-25137 | 1/1992 | Japan . |
| 6-45377 | 2/1994 | Japan . |

*Primary Examiner*—Patrick Ryan
*Assistant Examiner*—Zidia T. Pittman

[57] ABSTRACT

An object of the invention is to surely bond a semiconductor chip onto a chip substrate by heat-melting a brazing filler metal as required. A die bonding apparatus which is provided with a substrate holder for holding a chip substrate, a collet for conveying and pressing a semiconductor chip onto the chip substrate held by the substrate holder, a heater for heat-melting a brazing filler metal interposed between the chip substrate and the semiconductor chip, a temperature sensor for detecting the heating temperature of the brazing filler metal, and controlling means for controlling the heater based on the temperature detected by the temperature sensor. The temperature sensor is disposed in the collet.

6 Claims, 9 Drawing Sheets

DIE BONDING APPARATUS

BACKGROUND OF THE INVENTION

1. Field of the Invention

The present invention relates to a die bonding apparatus for bonding a semiconductor chip onto a chip substrate by using of a brazing filler metal.

2. Description of the Related Art

In the process of manufacturing a semiconductor integrated circuit such as an IC and a LSI, die bonding for bonding a semiconductor chip onto a chip substrate is performed, and to perform die bonding, a die bonding apparatus is used. A known die bonding apparatus has, for example, a structure shown in FIG. 9. The illustrated die bonding apparatus has a substrate holder 4 for holding a chip substrate 2. The substrate holder 4 comprises a positioning member 6 for positioning the chip substrate 2 in a die bonding work area, and a supporting member 8 for supporting the chip substrate 2 in the die bonding work area. The positioning member 6 comprises a block-form member, and a positioning concave 10 is provided in the center of the positioning member 6. When die bonding is performed, the chip substrate 2 is positioned in the positioning concave 10. The supporting member 8 comprises, for example, an oven having a flat top surface, and the chip substrate 2 is placed on the top surface. A heater 12 is incorporated in the supporting member 8.

Figure 9:
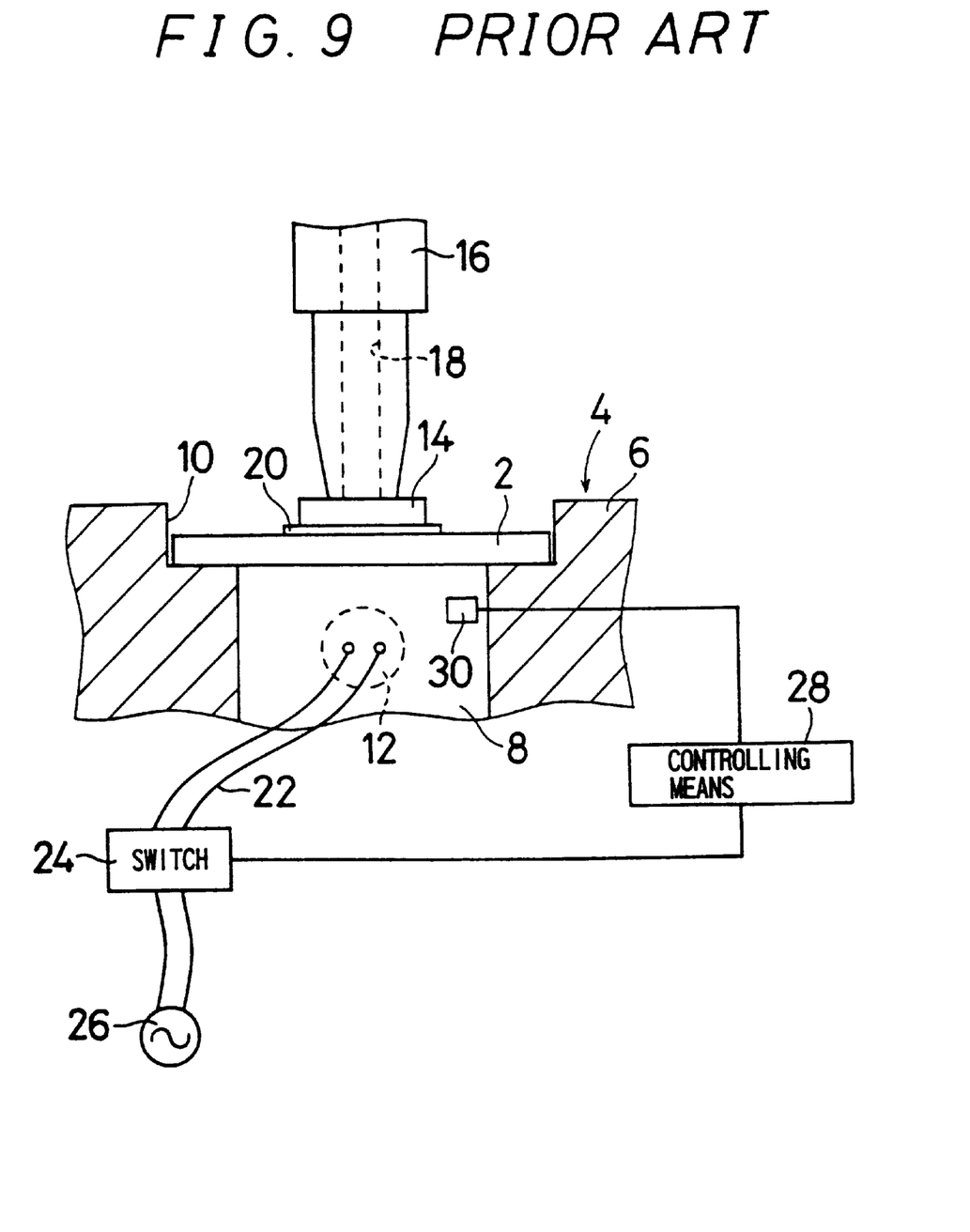
FIG. 9 is a cross-sectional view showing a part of the structure of a conventional die bonding apparatus.

The die bonding apparatus also has a collet 16 for conveying a semiconductor chip 14 onto the chip substrate 2 held in the die bonding work area. In the collet 16, an axially extending through hole 18 is formed. The through hole 18 is connected to a pressure-reducing source (not shown). When an action of reducing the pressure from the pressure-reducing source acts is on the semiconductor chip 14, the semiconductor chip 14 is sucked and supported by the tip of the collet 16. The collet 16 conveys the semiconductor chip 14 onto the chip substrate 2 in the die bonding work area while sucking and supporting the chip 14.

The semiconductor chip 14 is bonded onto the chip substrate 2 through a brazing filler metal 20. The brazing filler metal 20 is interposed between the chip substrate 2 and the semiconductor chip 14, and by heat-melting the brazing filler metal 20, the semiconductor chip 14 is bonded onto the chip substrate 2. Heat-melting of the brazing filler metal 20 is performed by the heater 12 incorporated in the supporting member 8. Lead wires 22 from the heater 12 are electrically connected to an AC power source 26 through a switch 24. Opening and closing, that is, the on and off of the switch 24 is controlled by controlling means 28. A temperature sensor 30 for detecting the heat-melting temperature of the brazing filler metal 20 is disposed in a predetermined position of the supporting member 8. The detection signal from the temperature sensor 30 is supplied to the controlling means 28.

In this die bonding apparatus, the chip substrate 2 is placed on the substrate holder 4 as required, and on the chip substrate 2 which is thus held is placed the semiconductor chip 14 by the collet 16 as required. When die bonding is performed, the collet 16 functions as pressing means, and presses the semiconductor chip 14 toward the chip substrate 2. When the chip substrate 2 is heated by the heater 12 under this condition, the brazing filler metal 20 is heat-melted by the heat from the chip substrate 2, and the brazing filler metal 20 is set, whereby the semiconductor chip 14 is bonded onto the chip substrate 2 as required. The temperature of the brazing filler metal 20 is controlled based on the detection signal from the temperature sensor 30. When the temperature detected by the temperature sensor 30 becomes lower than a predetermined lower limit temperature, the controlling means 28 closes (turns on) the switch 24, so that the heater 12 is heated to increase the temperature of the brazing filler metal 20. When the temperature detected by the temperature sensor 30 becomes higher than a predetermined upper limit temperature, the controlling means 28 opens (turns off) the switch 24, so that heating by the heater 12 is stopped to decrease the temperature of the brazing filler metal 20. By thus controlling the on and off of the heater 12 by the controlling means 28, the temperature of the brazing filler metal 20 is maintained within a predetermined temperature range of not less than the predetermined lower limit temperature and not more than the predetermined upper limit temperature, thereby ensuring bonding the semiconductor chip 14 onto the chip substrate 2 through the brazing filler metal 20.

However, in the conventional die bonding apparatus shown in FIG. 9, the following problems to be solved arise in association with the fact that the temperature sensor 30 is disposed in the supporting member 8 of the substrate holder 4. Since the chip substrate 2 is placed on the top surface of the supporting member 8 at each time of die bonding, when die boding is repetitively performed and the number of times of die bonding increases, the top surface becomes rough or dirt adheres to the top surface. When the top surface thus becomes rough or dirt adheres to the top surface, the adherence between the top surface of the supporting member 8 and the chip substrate 2 deteriorates, so that transmitting the heat from the heater 12 to the chip substrate 2 deteriorates. For this reason, there is a difference between the temperature detected by the temperature sensor 30 disposed in the supporting member 8 and the actual heat-melting temperature of the brazing filler metal 20, so that the controlling means 28 controls the temperature based on a determination that a desired heat-melting temperature is reached although the actual heat-melting temperature of the brazing filler metal 20 is lower than the desired temperature. Consequently, the brazing filler metal 20 is not sufficiently heat-melted, so that it is impossible to surely bond the semiconductor chip 14 onto the chip substrate 2.

Moreover, in this die bonding apparatus, since the side of the chip substrate 2 is heated, the temperature of the chip substrate 2 is held comparatively high. On the contrary, since the semiconductor chip 14 is pressed by the collet 16, the heat of the semiconductor chip 14 is absorbed by the collet 16, so that the temperature of the semiconductor chip 14 is lower than that of the chip substrate 2. Consequently, there is a temperature difference between the bottom surface of the chip substrate 2 that is in contact with the supporting member 8 and the top surface of the semiconductor chip 14 that is in contact with the collet 16. When the temperature difference is large, a thermal distortion occurs due to the difference in thermal expansion coefficient between the chip substrate 2 and the semiconductor chip 14, so that it is difficult to surely bond the substrate 2 and the chip 14.

Another prior art is shown in Japanese Unexamined Patent Publication JP-A-4-25137(1992). In this prior art, when a semiconductor chip is die-bonded onto a ceramic package, the semiconductor chip is gradually heated by a heater provided in a vacuum collet while the semiconductor chip being sucked and held by the vacuum collet is being conveyed to the package, and the semiconductor chip is heated substantially to the temperature of the package. By doing this, the semiconductor chip is prevented from being abruptly heated when the semiconductor chip is brought into contact with the package, thereby preventing the semiconductor chip from deteriorating by being abruptly heated.

Yet another prior art is shown in Japanese Unexamined Patent Publication JP-A-6-45377(1994). In this prior art, to curb the warpage of the semiconductor chip due to heat, a thermocouple and a heating resistor are provided in the collet body that sucks the semiconductor chip, and based on the temperature detected by the thermocouple, the collet body heated by the heating resistor is controlled so that the temperature of the collet body is held at a predetermined constant temperature, thereby curbing the warpage of the chip due to the heat at the time of die bonding.

Still another prior art is shown in Japanese Unexamined Utility Model Publication JP-U-63-20430(1988). In this prior art, a sheath heater and a temperature sensor are embedded in the collet. The temperature of the sheath heater is controlled based on temperature information from the temperature sensor, and after the semiconductor chip is vacuum-sucked by the collet, the semiconductor chip is pre-heated to an appropriate temperature before being mounted, thereby reducing the mounting time and relieving stress caused by an abrupt change in temperature of the semiconductor chip.

In the prior art shown in JP-A-4-25137(1992), a heater wire is provided in the collet that sucks the semiconductor chip and the collet is gradually heated. In the prior art shown in JP-A-6-45377(1994), the thermocouple and the heating resistor are provided in the collet body. In the prior art shown in JP-U-63-20430(1988), the sheath heater and the temperature sensor are provided inside the collet.

In the prior art, the semiconductor chip is heated by the heat from the collet, and a brazing filler metal or solder is heat-melted to perform die bonding. Since the temperature sensor is provided inside the collet to detect the temperature of the collet and does not detect the surface temperature of the collet, although the semiconductor chip is heated by the heat from the collet with the semiconductor chip being sucked by the end surface of the end portion of the collet, the heating temperature is controlled based on the inside temperature of the collet. For this reason, the adjustment of the heating temperature of the collet for heat-melting the solder or the brazing filler metal is inaccurate, so that there are cases where the solder or the brazing filler metal cannot be heat-melted to an appropriate state. As a result, the reliability of bonding of the semiconductor chip onto the chip substrate is low.

SUMMARY OF THE INVENTION

An object of the invention is to provide a die bonding apparatus capable of surely bonding a semiconductor chip onto a chip substrate by heat-melting a brazing filler metal as required.

Another object of the invention is to provide a die bonding apparatus capable of reducing the occurrence of a thermal distortion due to a temperature difference between a chip substrate and a semiconductor chip to thereby surely bond the chip substrate and the semiconductor chip.

The invention provides a die bonding apparatus comprising:
  a substrate holder for holding a chip substrate;
  pressing means for pressing a semiconductor chip on the chip substrate held by the substrate holder;
  heating means for heat-melting a brazing filler metal interposed between the chip substrate and the semiconductor chip;
  a temperature sensor provided at least in the pressing means, for detecting a surface temperature of the pressing means; and
  controlling means for controlling a heating operation of the heating means based on a temperature detected by the temperature sensor.

According to the invention, since the temperature sensor detects the surface temperature of the pressing means, the heat-melting temperature of the brazing filler metal is detected on the side of the pressing means, that is, on the side where the brazing filler metal is in contact with the semiconductor chip. Since the pressing means hardly becomes rough or dirty unlike the substrate holder, by providing the temperature sensor to the pressing means, the heat-melting temperature of the brazing filler metal can precisely be detected. Therefore, the actual heat-melting temperature of the brazing filler metal can be maintained within a predetermined range and the semiconductor chip can surely be bonded onto the chip substrate with high reliability.

In the invention it is preferable that the heating means comprises a heater provided at least in the pressing means.

According to the invention, since the heating means is provided in the pressing means, heating of the brazing filler metal is performed from the side of the pressing means. As mentioned above, since the pressing means hardly becomes rough or dirty unlike the substrate holder, by providing the pressing means with the heating means, the heat from the heating means is surely transmitted to the brazing filler metal through the semiconductor chip. Consequently, the brazing filler metal can be heat-melted as required, so that the semiconductor chip can surely be bonded onto the chip substrate.

In the invention it is preferable that the heating means comprises a first heater provided in the pressing means and a second heater provided in the substrate holder,
  that the temperature sensor comprises a first temperature sensor provided in the pressing means and a second temperature sensor provided in the substrate holder, and
  that the controlling means controls a heating operation of the first heater based on a temperature detected by the first temperature sensor and controls a heating operation of the second heater based on a temperature detected by the second temperature sensor.

According to the invention, since the first heater and the first temperature sensor are provided in the pressing means and the second heater and the second temperature sensor are provided in the substrate holder, the semiconductor chip is mainly heated by the first heater and the chip substrate is mainly heated by the second heater. Consequently, the temperatures of the semiconductor chip and the chip substrate can be maintained at required temperatures to thereby reduce the temperature difference therebetween, so that the occurrence of a thermal distortion due to the temperature difference can be curbed.

The invention is characterized in that the pressing means conveys, places and presses the semiconductor chip onto the chip substrate, and carries out the semiconductor chip which has been bonded onto the chip substrate, from the substrate holder together with the chip substrate.

According to the invention, since a collet also functions as the pressing means, the structure of the die bonding apparatus can be simplified.

In the invention it is preferable that means for conveying and placing the semiconductor chip onto the chip substrate is provided separately from the pressing means.

According to the invention, since the means for conveying and placing the semiconductor chip onto the chip substrate is provided separately from the pressing means, the succeeding semiconductor chip to be die-bonded can be conveyed to a work area separately from the operation of pressing the semiconductor chip by the pressing means and the semiconductor chip which has been die-bonded can be carried out from the work area together with the chip substrate. Consequently, the conveying/carrying out operation and the heat-melting operation can be performed in parallel. This reduces the work time, so that productivity can be improved.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
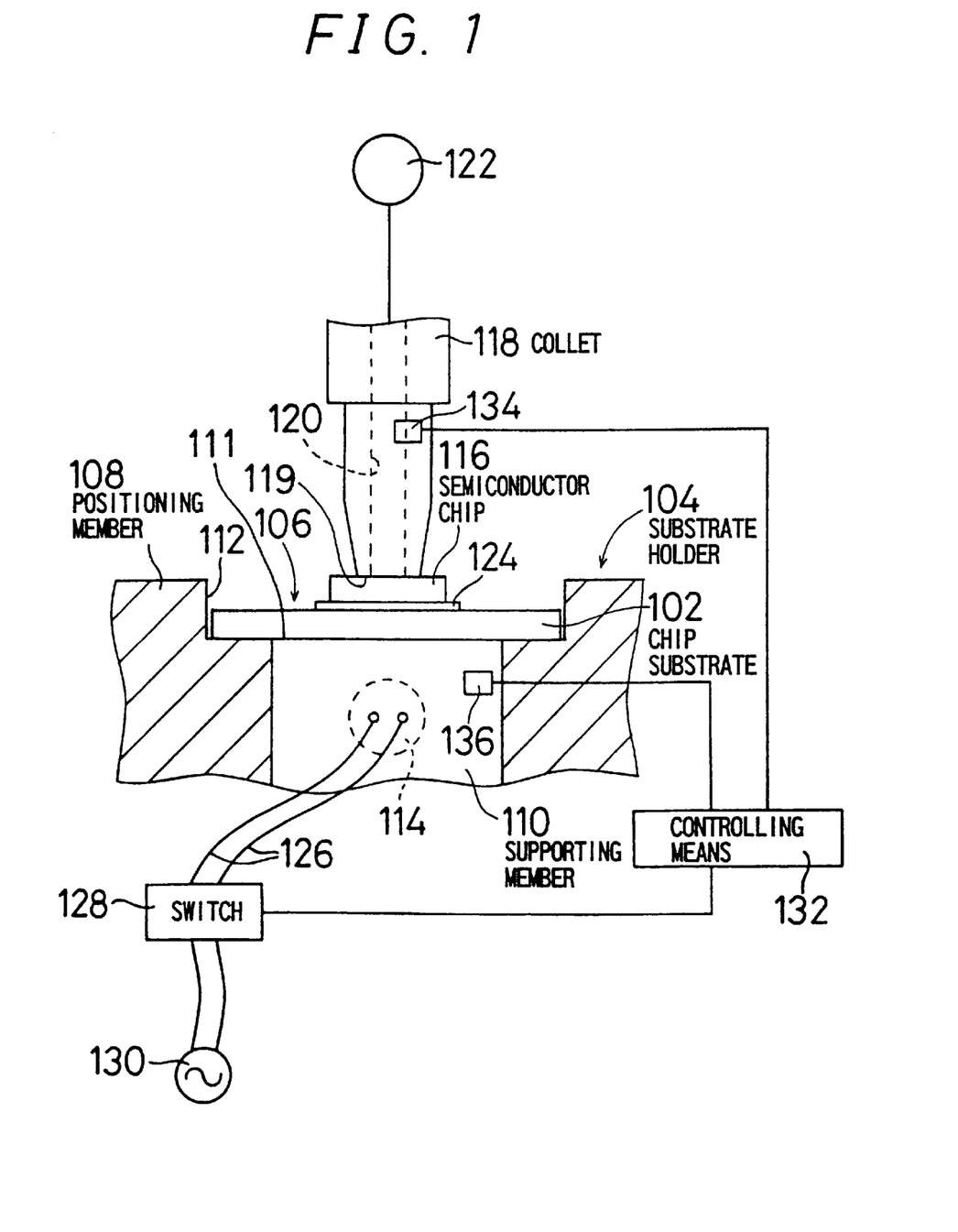
FIG. 1 is a cross-sectional view briefly showing a part of a die bonding apparatus according to a first embodiment of the invention.

Now referring to the drawings, preferred embodiments of the invention are described below.
First Embodiment FIG. 1 is a cross-sectional view briefly showing a relevant part of a first embodiment of a die bonding apparatus according to the invention. The die bonding apparatus has a substrate holder 104 for holding a chip substrate 102 such as a stem or a lead frame. The substrate holder 104 comprises a positioning member 108 for positioning the chip substrate 102 in a die bonding work area 106, and a supporting member 110 for supporting the chip substrate 102 in the die bonding work area 106. The positioning member 108 comprises a block-form member, and a positioning concave 112 whose lateral cross section vertical to the plane of FIG. 1 is rectangular is provided in the center of the positioning member 108 viewed from above in FIG. 1. The configuration of the plane, viewed from above in FIG. 1, of the positioning concavity 112 has a rectangular shape slightly larger than the chip substrate 102 so as to correspond to the configuration of the chip substrate 102 to be positioned in the concave 112. When die bonding is performed, positioning of the chip substrate 102 is performed with the chip substrate 102 being embedded in the positioning concavity 112.

The supporting member 110 whose lateral cross section vertical to the plane of FIG. 1 is rectangular is slightly smaller than the chip substrate 102 to be die-bonded, and is disposed in the center of the positioning concave 112 of the positioning member 108 viewed from above in FIG. 1. The supporting member 110 comprises an oven having a flat top surface 111, and the top surface 111 is used as a surface where the chip is placed. The chip substrate 102 is placed on the chip placement surface in a manner described later.

A heater 114 constituting heating means is incorporated in the supporting member 110. The heater 114 heats the chip substrate 102 through the supporting member 110.

The die bonding apparatus also has a collet 118 for conveying and placing the semiconductor chip 116 which is called pellet, onto the chip substrate 102 held in the die bonding work area 106. In the collet 118, an axially extending through hole 120 is formed. The through hole 120 is connected to a pressure-reducing source 120, such as a pressure-reducing pump. When the pressure-reducing source 120 is actuated, suction from the pressure-reducing source 122 acts on the semiconductor chip 116 through the through hole 120, so that the semiconductor chip 116 is sucked and held by the tip of the collet 118.

The collet 118 is held so as to be movable in a lateral direction between a first position (not shown) and a second position shown in FIG. 1. When the collet 118 is located at the first position, the collet 118 is situated in a pickup area (not shown) for sucking and holding the semiconductor chip 116 being cut. When the collet 118 is moved to the second position, the collet 118 is situated in the die bonding work area 106 for placing the semiconductor chip 116 on the chip substrate 102 on the substrate holder 104. The collet 118 is held so as to be movable also in a vertical direction between an ascent position (not shown) and a descent position shown in FIG. 1. When the collet 118 is located at the descent position in the first position, the collet 118 sucks and holds the semiconductor chip 116. When the collet 118 located at the descent position in the second position, the collet 118 places the semiconductor chip 116 on the chip substrate 102 and presses the semiconductor chip 116 toward the substrate 102. When the collet 118 is located at the ascent position, the collet 118 moves between the first position and the second position.

The semiconductor chip 116 is bonded onto the chip substrate 102 through a brazing filler metal 124. When the semiconductor chip 116 is placed on the chip substrate 102, the brazing filler metal 124 realized, for example, as a gold antimony foil is applied onto the chip substrate 102, and the brazing filler metal 124 is interposed between the chip substrate 102 and the semiconductor chip 116. Heat-melting the brazing filler metal 124 is performed by the heater 114 incorporated in the supporting member 110. Lead wires 126 from the heater 114 are electrically connected to an AC power source 130 through a switch 128. The opening/closing, that is, on/off of the switch 128 is controlled by controlling means 132.

In this embodiment, two sensors 134 and 136 are used as the temperature sensors for detecting the heat-melting temperature of the brazing filler metal 124. The first temperature sensor 134 is disposed in the vicinity of the end portion of the collet 118. The second temperature sensor 136 is disposed in a predetermined position in the supporting member 110, specifically, in a position in the vicinity of the top surface 111. The first and the second temperature sensors 134 and 136 comprise, for example, thermocouples.

The first temperature sensor 134 is provided for measuring the surface temperature of the semiconductor chip 116 to determine whether the heat by the heater 114 is surely transmitted or not. The second temperature sensor 136 is provided for determining whether the heater 114 operates normally or not. The controlling means 132 is realized, for example, as a microcomputer, and controls opening and closing of the switch 128 based on the detection signals from the first and the second temperature sensors 134 and 136 to thereby control heating by the heater 114.

Figure 2:
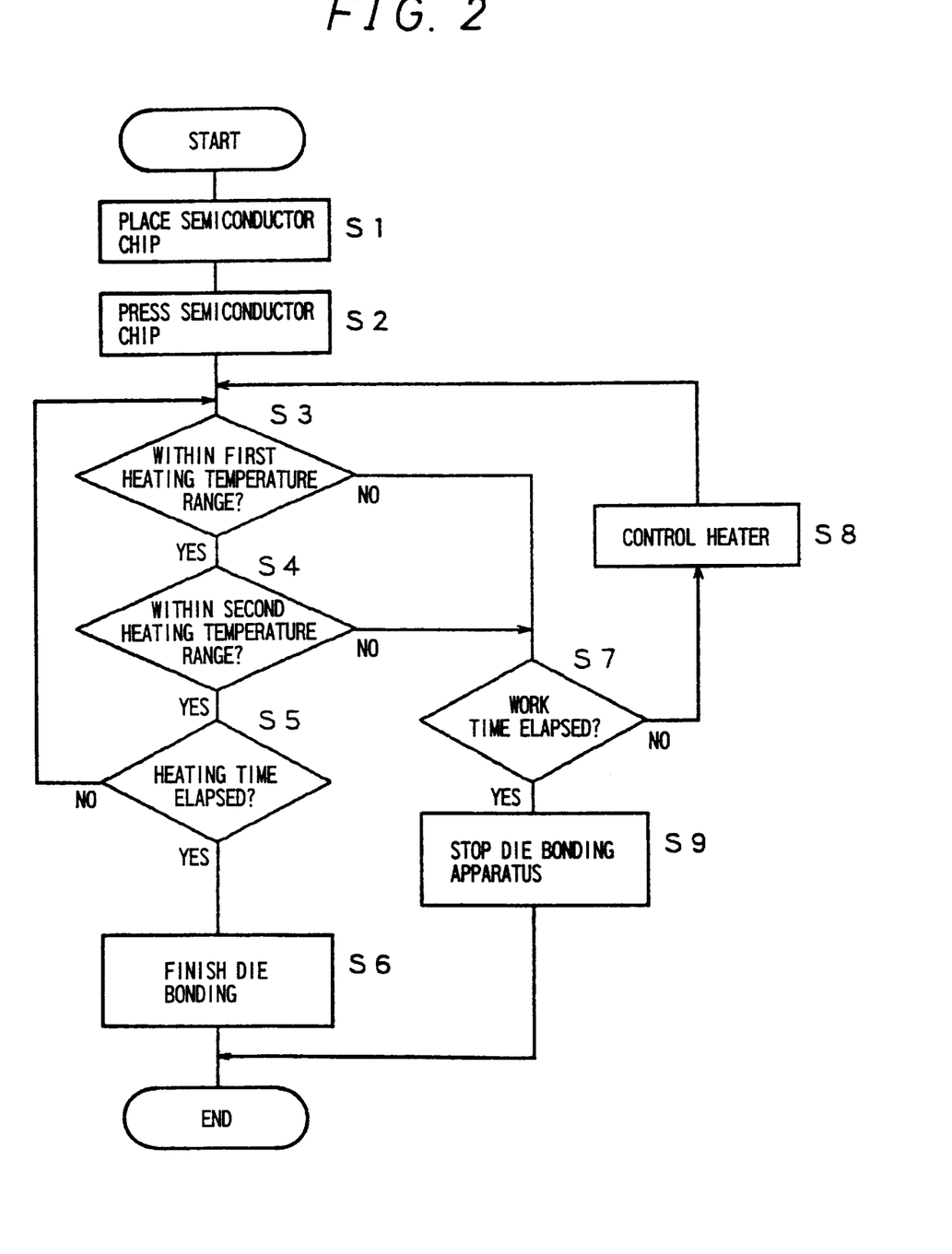
FIG. 2 is a flowchart of assistance in explaining die bonding by the die bonding apparatus of FIG. 1.

Die bonding by the die bonding apparatus of the first embodiment is performed through the steps shown in the flowchart of FIG. 2. Referring to FIG. 2 together with FIG. 1, first, at step S1, the chip substrate 102 is positioned in the positioning concave 112 of the positioning member 108 of the substrate holder 104, and the chip substrate 102 is placed on the top surface of the supporting member 110. Then, the brazing filler metal 124 is applied onto the chip substrate 102 being thus held, and the semiconductor chip 116 is placed by the collet 118 with the brazing filler metal 124 in between. Then, at step S2, the semiconductor chip 116 is pressed by the collet 118. In this embodiment, since the semiconductor chip 116 is pressed toward the chip substrate 102 by the collet 118 in die bonding, the collet 118 also functions as the pressing means.

The process proceeds to step S3, where it is determined whether or not a temperature T2 detected by the second temperature sensor 136 is within a first heating temperature range, for example, 250° C.$\leq$T2$\leq$260° C. In die bonding, the actuation of the heater 114 is controlled by the controlling means 132. Therefore, when the chip substrate 102 is placed and the semiconductor chip 116 is placed thereon and pressed, heat-melting of the brazing filler metal 124 is started by the heat from the heater 114, thus starting the die bonding by the die bonding apparatus.

When the temperature T2 detected by the second temperature sensor 136 is within the first heating temperature range at step S3, the process proceeds to step S4, where it is determined whether or not a temperature T1 detected by the first temperature sensor 134 is within a second heating temperature range, for example, 240° C.$\leq$T1$\leq$250° C. When the temperature T1 detected by the first temperature sensor 134 is within the second heating temperature range at step S4, the process proceeds to step S5, where it is determined whether a predetermined heating time has elapsed or not. Steps S3 to S5 are repetitively executed until the predetermined heating time elapses.

When the predetermined heating time has elapsed, the process proceeds from step S5 to step S6 to finish die bonding by the die bonding apparatus. The heating at step S5 is a time sufficient for the brazing filler metal 124 to be heat-melted by the heater 114. Therefore, when the temperature T2 detected by the second temperature sensor 136 is held within the first heating temperature range and the temperature T1 detected by the first temperature sensor 135 is held in the second heating temperature range for the predetermined heating time, the brazing filler metal 124 is heat-melted, so that the semiconductor chip 116 is surely bonded onto the chip substrate 102 by the brazing filler metal 124.

When the temperature T2 detected by the second temperature sensor 136 is outside the first heating temperature range at step S3, the process proceeds from step S3 to step S7. When the temperature T1 detected by the first temperature sensor 134 is outside the second heating temperature range at step S4, the process proceeds from step S4 to step S7. At step S7, it is determined whether a work time for which die bonding is performed has elapsed or not. When the work time has not elapsed, the process proceeds to step S8, where controlling the heater 114 by the controlling means 132 is performed. The work time is slightly longer than the heating time at step S5, and is set at a time sufficient for the brazing filler metal 124 to be heat-melted after the end portion of the collet 118 is heated by the heater 114.

At step S8, when the temperature T2 detected by the second temperature sensor 136 is lower (or higher) than the first heating temperature range, the controlling means 132 closes (or opens) the switch 128, so that heating by the heater 114 is performed (or heating is stopped). Thus, the actuation of the heater 114 is controlled so that the heat-melting temperature of the brazing filler metal 124 is held within the predetermined temperature range.

When the temperature T1 detected by the first temperature sensor 134 is lower (or higher) than the second heating temperature range, the controlling means 132 closes (or opens) the switch 128, so that heating by the heater 114 is performed (or heating is stopped). Thus, the actuation of the heater 114 is controlled so that the heat-melting temperature of the brazing filler metal 124 is held within the predetermined temperature range. After controlling.at step S8, the process returns to step S3.

When the temperature T2 detected by the second temperature sensor 136 becomes a temperature within the first heating temperature range by controlling the heater 114, the process proceeds to step S4. When the temperature T1 detected by the first temperature sensor 134 becomes a temperature within the second heating temperature range by controlling the heater 114, the process proceeds to step S5. Thus, steps S3 to S5 are executed.

When the temperature T2 detected by the second temperature sensor 136 is outside the first heating temperature range even though controlling the heater 114 is performed or when the temperature T1 detected by the first temperature sensor 134 is outside the second heating temperature range even though controlling the heater 114 is performed, the process again proceeds to step S7, where it is determined whether the work time for which die bonding is performed has elapsed or not. When the work time has thus elapsed, the process proceeds to step S9, where determining that the die bonding apparatus is out of order, the actuation of the apparatus is stopped.

Thus, in the die bonding apparatus of the first embodiment, since the heat-melting temperature of the brazing filler metal 124 is detected by the first temperature sensor 134 provided in the collet 118 and the second temperature sensor 136 provided in the supporting member 110 and the heater 114 is controlled based on the temperatures T1 and T2 detected by the sensors 134 and 136, the brazing filler metal 124 can be held at a predetermined heat-melting temperature, so that the semiconductor chip 116 can surely be bonded onto the chip substrate 102. In particular, since the first temperature sensor 134 is provided in the collet 118, the heat-melting temperature of the brazing filler metal 124 can precisely be detected. An end surface 119 of the collet 118 hardly becomes rough through use and dirt hardly adheres to the tip surface 119. Consequently, the heat from the brazing filler metal 124 is surely transmitted, so that the heat-melting temperature of the brazing filler metal 124 can precisely be detected.

In the above-described first embodiment, the heat-melting temperature of the brazing filler metal 124 is detected by the first temperature sensor 134 provided in the collet 118 and the second temperature sensor 136 provided in the supporting member 110. However, it is unnecessary to provide two sensors; the heat-melting temperature of the brazing filler metal 124 can precisely be maintained within the predetermined temperature range by controlling the heater 114 based on only the temperature T1 detected by the first temperature sensor 134 provided in the collet 118.

Second Embodiment

Figure 3:
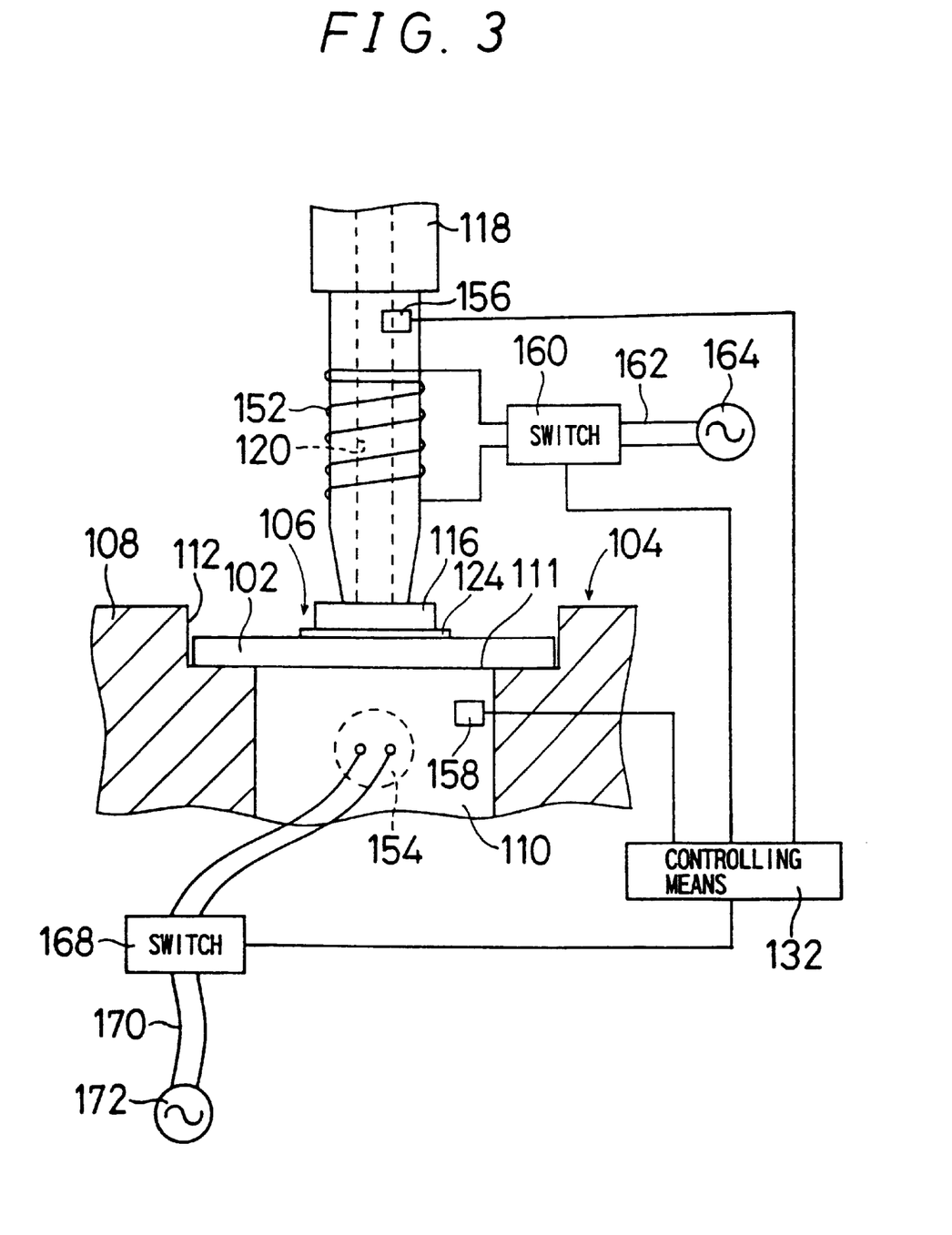
FIG. 3 is a cross-sectional view briefly showing a part of a second embodiment of a die bonding apparatus according to the invention.

FIG. 3 is a cross-sectional view briefly showing a relevant part of a second embodiment of the die bonding apparatus according to the invention. In the second embodiment shown in FIG. 3, a description will be given with parts corresponding to those of the first embodiment being designated by the same reference numerals.

Referring to FIG. 3, in the second embodiment, a first and a second heaters 152 and 154 are provided as the heating means for heat-melting the brazing filler metal 124 interposed between the chip substrate 102 and the semiconductor chip 116, and a first and a second temperature sensors 156 and 158 are provided as the temperature sensors for detecting the heat-melting temperature of the brazing filler metal 124. The first heater 152 is provided on the end portion of the collet 118. The heat from the first heater 152 is transmitted to the brazing filler metal 124 through the collet 118 and the semiconductor chip 116. The second heater 154 is, like in the first embodiment, incorporated in the supporting member 110 comprising an oven, and the heat from the second heater 154 is transmitted to the brazing filler metal 124 through the supporting member 110 and the chip substrate 102. The first heater 152 is electrically connected to an AC power source 164 through lead wires 162 where a first switch 160 is provided. The second heater 154 is electrically connected to an AC power source 172 through lead wires 170 where a second switch 168 is provided.

The first temperature sensor 156 is disposed in association with the first heater 152, and detects the heat-melting temperature of the brazing filler metal 124 by the first heater 152. The second temperature sensor 158 is disposed in association with the second heater 154, and detects the heat-melting temperature of the brazing filler metal 124 by the second heater 154. The first temperature sensor 156 is provided for measuring the temperature to which the collet 118 is pre-heated for improving the efficiency of heating to the semiconductor chip 116 by reducing the temperature difference between the chip substrate 102 and the semiconductor chip 116. The second temperature sensor 158 is provided for determining whether the heater 154 operates normally or not.

The detection signals from the first and the second temperature sensors 156 and 158 are supplied to the controlling means 132. Based on the detection signals from the sensors 156 and 158, the controlling means 132 controls opening and closing of the first and the second switches 160 and 168. Except this, the structure of the die bonding apparatus of the second embodiment is substantially the same as that of the first embodiment, and a detailed description thereof will therefore be omitted.

Figure 4:
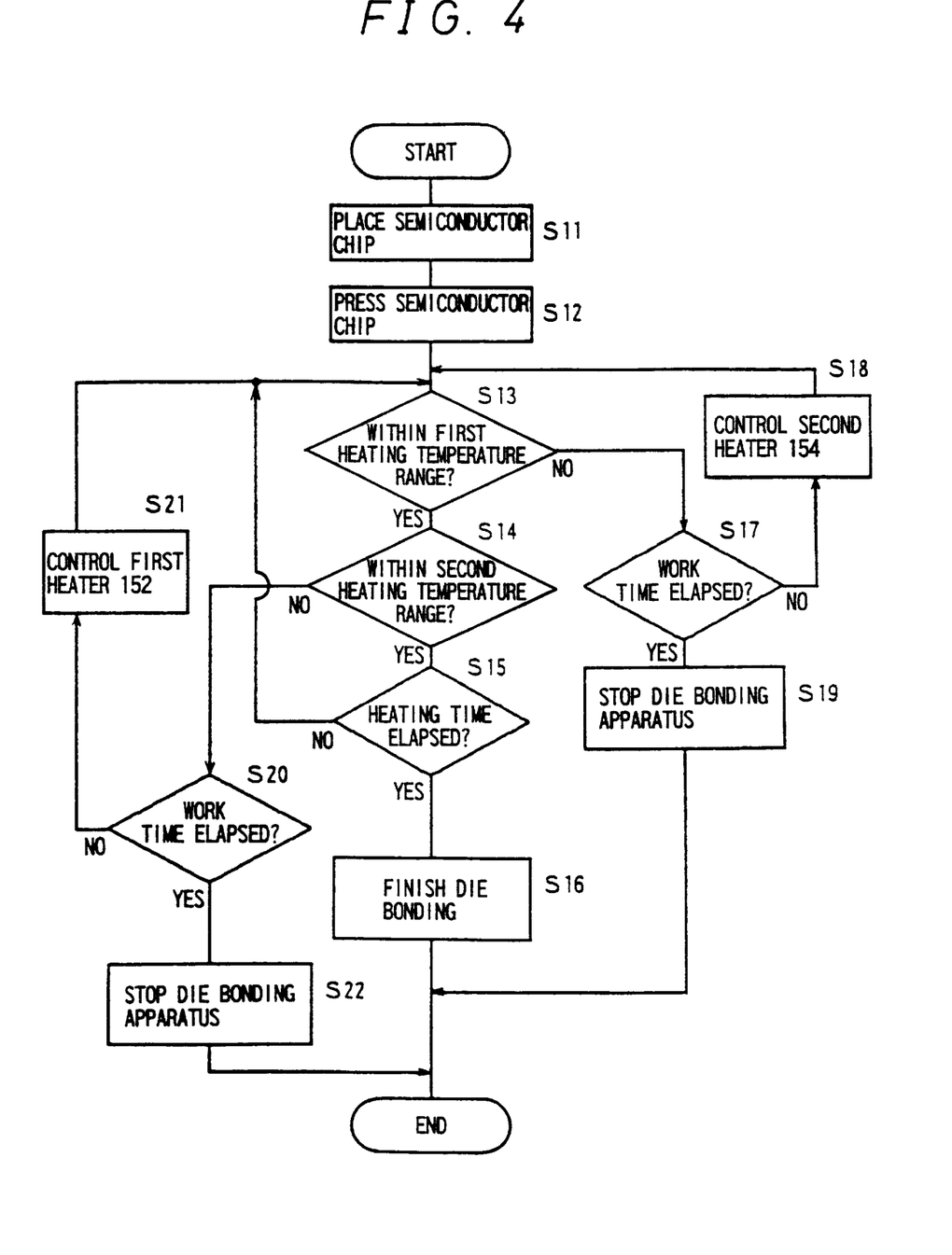
FIG. 4 is a flowchart of assistance in explaining die bonding by the die bonding apparatus of FIG. 3.

Die bonding by the die bonding apparatus of the second embodiment is performed through the steps shown in the flowchart of FIG. 4. Referring to FIGS. 3 and 4, first, at step S11, the chip substrate 102 is positioned in the positioning concave 112 of the positioning member 108, and the chip substrate 102 is placed on the top surface of the supporting member 110. Then, the brazing filler metal 124 is placed on the chip substrate 102, and the semiconductor chip 116 is placed on the brazing filler metal 124. Then, at step S12, the semiconductor chip 116 is pressed by the collet 118.

The process proceeds to step S13, where it is determined whether or not the temperature T2 detected by the second temperature sensor 158 is within the first heating temperature range, for example, whether or not the temperature T2 detected by the second temperature sensor 158 is within a range of 250° C.$\leq$T2$\leq$260° C. When the temperature T2 detected by the second temperature sensor 158 is within the first heating temperature range at step S13, the process proceeds to step S14, where it is determined whether or not the temperature T1 detected by the first temperature sensor 156 is within the second heating temperature range, for example, whether or not the temperature T1 detected by the first temperature sensor 156 is within a range of 240° C.$\leq$T1$\leq$260° C.

When the temperature T1 detected by the first temperature sensor 156 is within the second heating temperature range at step S14, the process proceeds to step S15, where it is determined whether the predetermined heating time has elapsed or not. Steps S13 to S15 are repetitively executed until the predetermined heating time elapses. When the predetermined heating time has elapsed, the process proceeds from step S15 to step S16 to finish die bonding by the die bonding apparatus.

The heating time at step S15 is a time sufficient for the brazing filler metal 124 to be heat-melted by the first and the second heaters 152 and 154. Therefore, when the temperature T2 detected by the second temperature sensor 158 is held within the first heating temperature range and the temperature T1 detected by the first temperature sensor 156 is held in the second heating temperature range for the predetermined heating time, the brazing filler metal 124 is heat-melted, so that the semiconductor chip 116 is surely bonded onto the chip substrate 102 by the brazing filler metal 124.

When the temperature T2 detected by the second temperature sensor 158 is outside the first heating temperature range at step S13, the process proceeds from step S13 to step S17, where it is determined whether the work time for which die bonding is performed has elapsed or not. When the work time has not elapsed, the process proceeds to step S18, where controlling the second heater 154 by the controlling means 132 is performed. As the work time, a predetermined time being longer than the heating time at step S15 is set. At step S18, when the temperature T2 detected by the second temperature sensor 158 is lower (or higher) than the first heating temperature range, the controlling means 132 closes (or opens) the second switch 168, so that heating by the second heater 154 is performed (or heating is stopped). Thus, the heat transmitted from the supporting member 110 to the brazing filler metal 124 through the chip substrate 102 is controlled, and the actuation of the second heater 154 is controlled so that the heat-melting temperature of the brazing filler metal 124 is held within the predetermined temperature range. After controlling at step S18, the process returns to step S13. When the temperature T2 detected by the second temperature sensor 158 becomes a temperature within the first heating temperature range by controlling the second heater 154 at step S18, the process proceeds to step S14. Thus, steps S13 to S15 are executed.

When the temperature T2 detected by the second temperature sensor 158 is outside the first heating temperature range even though controlling the second heater 154 is performed, the process again proceeds to step S17, where it is determined whether the work time for which die bonding is performed has elapsed or not. When the work time has thus elapsed, the process proceeds to step S19, where determining that the die bonding apparatus is out of order, the actuation of the apparatus is stopped.

When the temperature T1 detected by the first temperature sensor 156 is outside the second heating temperature range at step S14, the process proceeds from step S14 to step S20, where it is determined whether the work time for which die bonding is performed has elapsed or not. When the work time has not elapsed, the process proceeds to step S21, where controlling the first heater 152 by the controlling means 132 is performed. As the work time, a predetermined time being longer than the heating time at step S15 is set. At step S21, like at step S18, when the temperature T1 detected by the first temperature sensor 156 is lower (or higher) than the second heating temperature range, the controlling means 132 closes (or opens) the first switch 160, so that heating by the first heater 152 is performed (or heating is stopped). Thus, the heat transmitted from the collet 118 to the brazing filler metal 124 through the semiconductor chip 116 is controlled, and the actuation of the first heater 152 is controlled so that the heat-melting temperature of the brazing filler metal 124 is held within the predetermined temperature range. After controlling at step S21, the process returns to step S13. When the temperature T1 detected by the first temperature sensor 156 becomes a temperature within the second heating temperature range by controlling the first heater 152 at step S21, the process proceeds to step S15. Thus, steps S13 to S15 are executed.

When the temperature T1 detected by the first temperature sensor 156 is outside the second heating temperature range even though controlling the first heater 152 is performed, the process again proceeds to step S20, where it is determined whether the work time for which die bonding is performed has elapsed or not. When the work time has thus elapsed, the process proceeds to step S22, where determining that the die bonding apparatus is out of order, the actuation of the apparatus is stopped.

Thus, in the die bonding apparatus of the second embodiment, since the heat-melting temperature of the brazing filler metal 124 is detected by the first temperature sensor 156 provided in the collet 118 and the second temperature sensor 158 provided in the supporting member 110 and the first and the second heaters 152 and 154 are controlled based on the temperatures T1 and T2 detected by the temperature sensors 156 and 158, like in the first embodiment, the brazing filler metal 124 can be held at a predetermined heat-melting temperature, so that the semiconductor chip 116 can surely be bonded onto the chip substrate 102. The heat from the first heater 152 is mainly transmitted to the semiconductor chip 116 through the collet 118 and the heat from the second heater 154 is mainly transmitted to the chip substrate 102 through the supporting member 110, so that the brazing filler metal 124 is efficiently heat-melted. Moreover, by this, the temperature difference between the chip substrate 102 and the semiconductor chip 116 can be reduced, so that the occurrence of a thermal distortion due to the temperature difference can be curbed.

Figure 5:
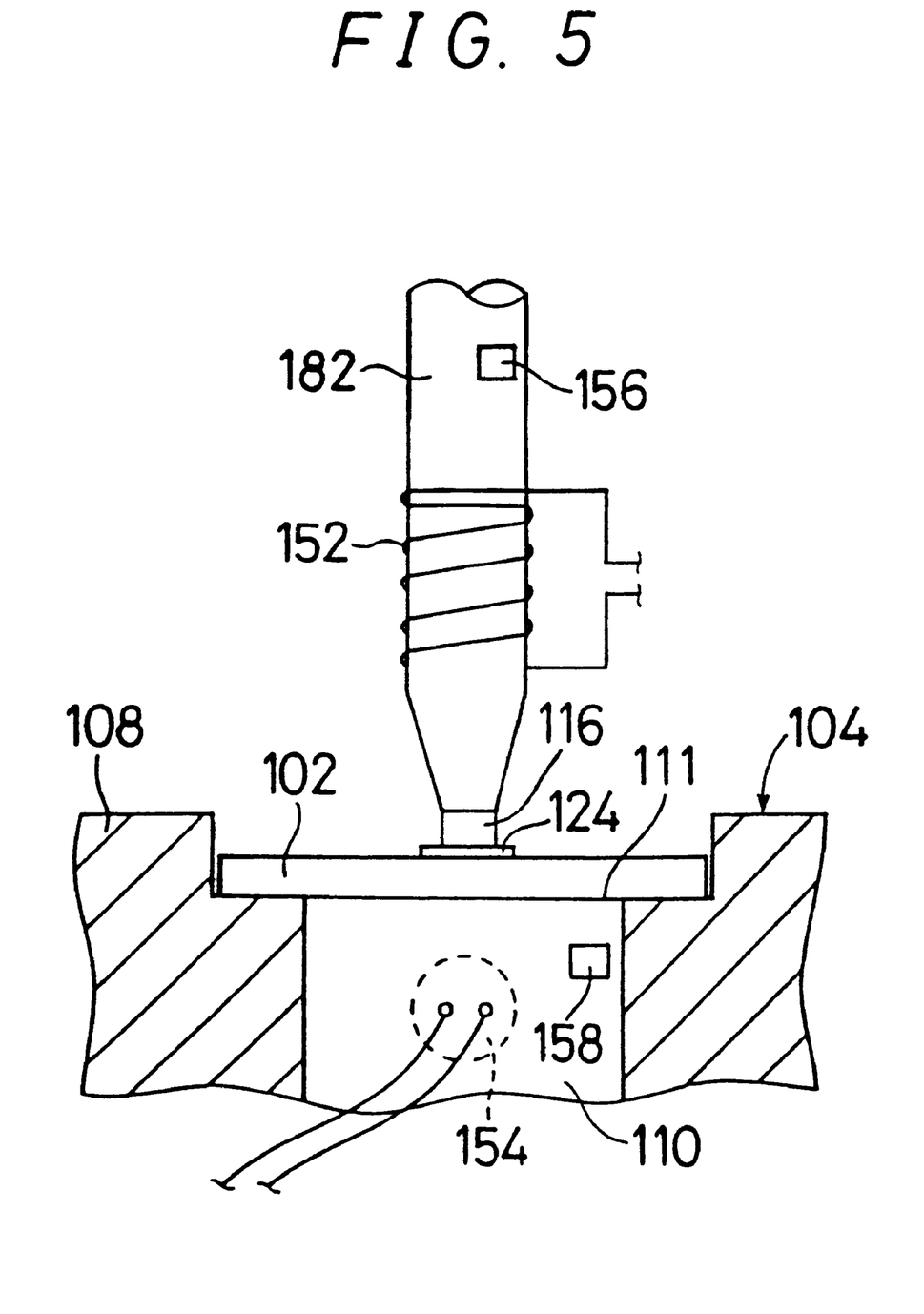
FIG. 5 is a cross-sectional view briefly showing a part of a third embodiment of a die bonding apparatus according to the invention.

FIG. 5 is a cross-sectional view briefly showing a part of

For such a brazing filler metal 124 to be melted, a predetermined time, for example, 5 to 30 seconds are necessary, and within this time, picking up the next semiconductor chip 116 from the adhesive sheet 186 is started by the conveying collet 118 as described above. When the melting time has elapsed and the brazing filler metal 124 is completely melted, the pressing member 182 again moves from the pressing condition shown in FIG. 8B to the lowering start position shown in FIG. 8A, and then, retreats to a predetermined wait position. The conveying collet 118 vacuum-sucking the next semiconductor chip 116 is situated at the position where the pressing member 182 is situated in FIG. 8A, and the semiconductor chip 116 bonded onto the chip substrate 102 is carried out to the succeeding process together with the chip substrate 102. Then, a new chip substrate 102 is placed in the positioning concave 112 on the supporting member 110, and the brazing filler metal 124 is placed on the new chip substrate 102. Then, the above-described steps m2 to m6 are repeated, and steps n1 to n4 are repeated until all the parts are die-bonded at step n4.

Figure 6:
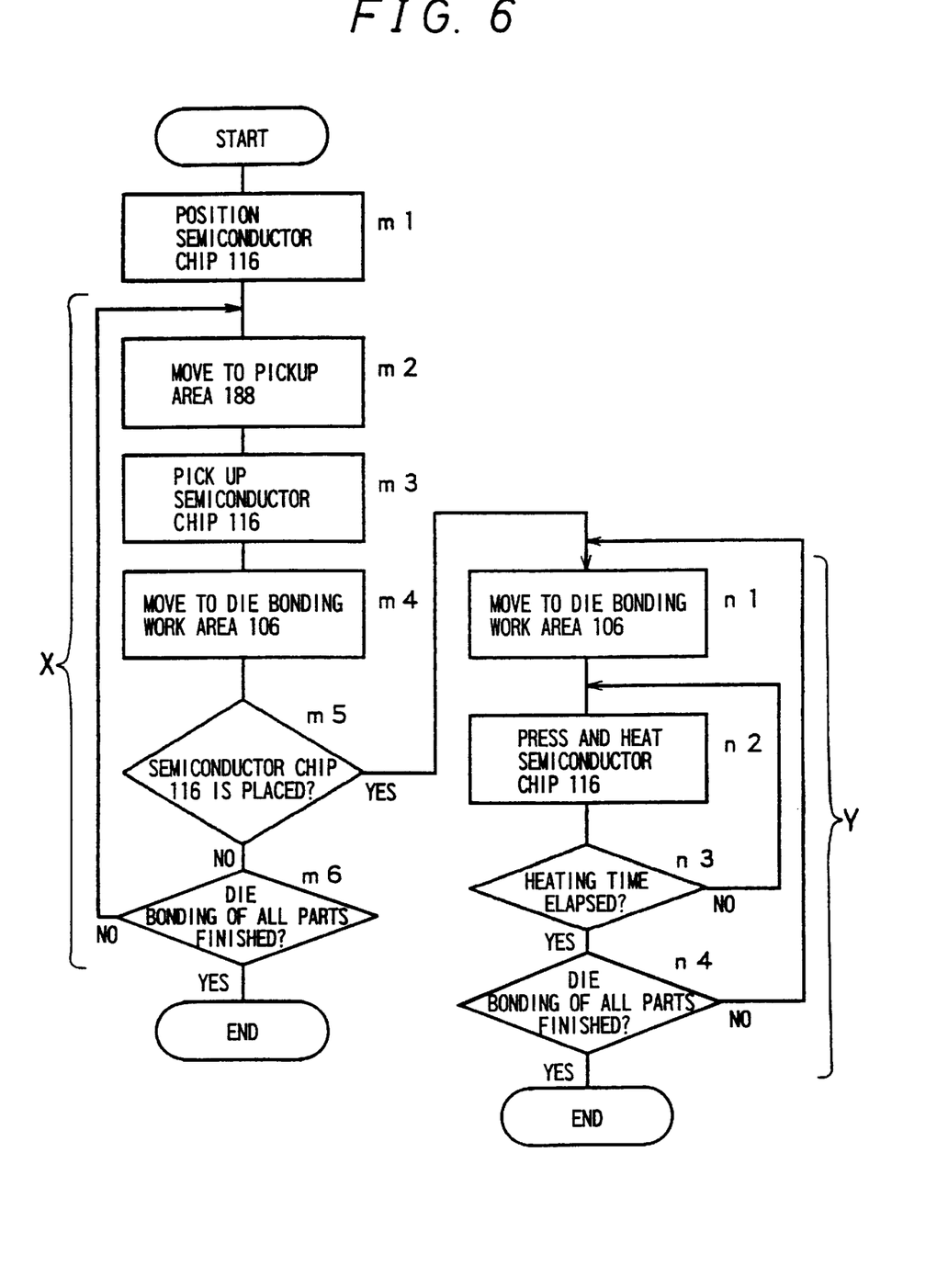
FIG. 6 is a flowchart of assistance in explaining the operation of the die bonding apparatus shown in FIG. 5.

Such conveying and carrying out, and pressing and heat-melting are performed in parallel, that is, a process X from steps m2 to m6 and a process Y from steps n1 to n4 in FIG. 6 are performed in parallel. Consequently, power consumption by the first and the second heaters 152 and 154 is minimized, so that high productivity can be achieved.

In the third embodiment, it is possible to omit the first heater 152 and heat-melt the brazing filler metal 124 by the second heater 154. Moreover, the second temperature sensor 158 can be omitted in addition to the first heater 152.

Having described various embodiments of the die bonding apparatus according to the invention, it is understood that the invention is not limited to these embodiments and that various changes and modifications may be made without departing from the scope of the invention. a die bonding apparatus according to a third embodiment of the invention. In the third embodiment, a pressing member 182 is specifically designed, for pressing the semiconductor chip 14 downward on the chip substrate 2 where the brazing filler metal 20 is placed is provided as the pressing means in performing die bonding. In the third embodiment, parts corresponding to those of the second embodiment are designated by the same reference numerals and descriptions thereof will be omitted.

Referring to FIG. 5, in this embodiment, the pressing member 182 is attached so as to be movable in a vertical direction. When the pressing member 182 is lowered as shown in FIG. 5, an end surface of the pressing member 182 acts on the semiconductor chip 116 to press the chip 116 downward toward the chip substrate 102. In the third embodiment, like in the second embodiment, the first heater 152 is provided on the end portion of the pressing member 182, and in association with the first heater 152, the first temperature sensor 156 is provided in the pressing member 182. Except this, the structure of the third embodiment is substantially the same as that of the second embodiment.

In the third embodiment, since the first heater 152 and the first temperature sensor 156 are provided in the pressing member 182 for pressing the semiconductor chip 116 and the second heater 154 and the second temperature sensor 158 are provided in the supporting member 110 for supporting the chip substrate 102, effects similar to those of the second embodiment are achieved. In the third embodiment, since the pressing member 182 for pressing the semiconductor chip 116 is necessary in addition to the collet for conveying the semiconductor chip 116, the structure of the apparatus is slightly complicated.

Figure 7A:
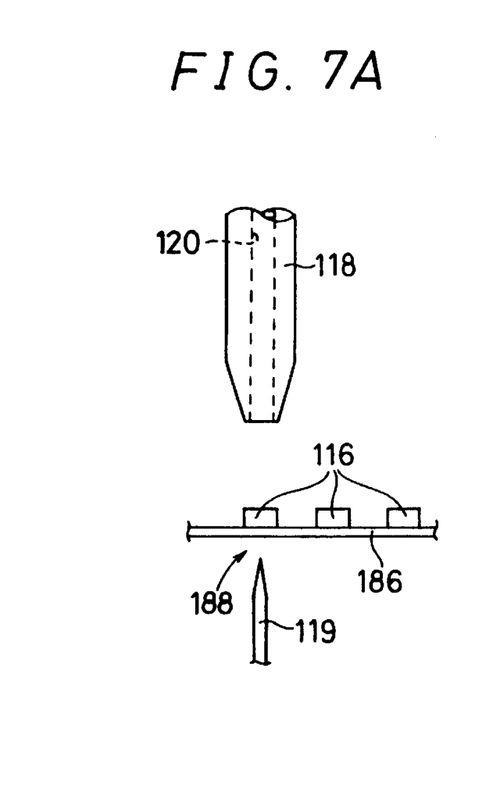
FIGS. 7A to 7C are views showing the operation of a collet 118 in a simplified form, FIG. 7A showing a condition before a semiconductor chip 116 is sucked by the collet 118, FIG. 7B showing a condition in which the semiconductor chip 116 is sucked by the collet 118, and FIG. 7C showing a condition in which the semiconductor chip 116 has been conveyed to a die bonding work area 106 immediately above a chip substrate 2 by the collet 118.
Figure 7B:
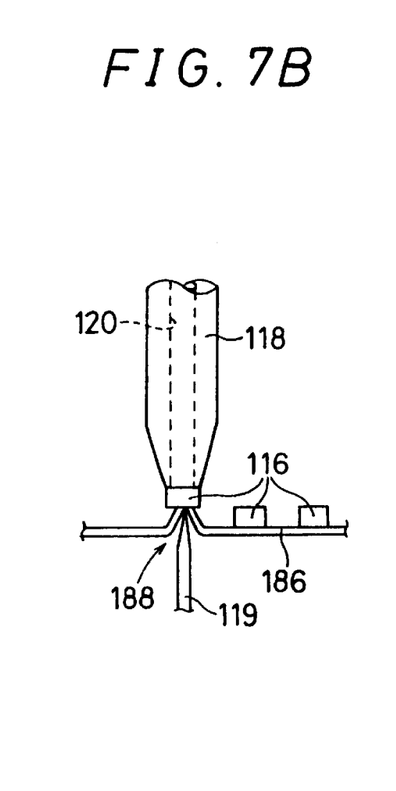
Figure 7C:
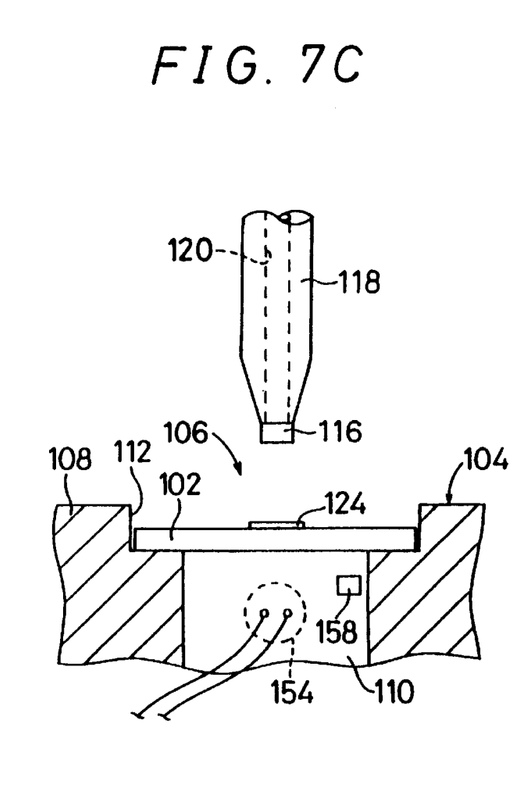

FIG. 6 is a flowchart of assistance in explaining the operation of the die bonding apparatus shown in FIG. 5. FIGS. 7A to 7C are views showing the operation of the collet 118 in a simplified form. FIG. 7A shows a condition before the semiconductor chip 116 is sucked at region 188 by the collet 118. FIG. 7B shows a condition in which the semiconductor chip 116 is sucked by the collet 118. FIG. 7C shows a condition in which the semiconductor chip 116 has been conveyed to the die bonding work area 106 immediately above the chip substrate 102 by the collet 118.

When die bonding is started, as shown in FIG. 7A, one of a plurality of semiconductor chips 116 aligned on an adhesive sheet 186 so as to be evenly spaced in the direction of the length of the adhesive sheet 186 is situated on a straight line common to the conveying collet 118 and a pushing up needle 119. Under this condition, the adhesive sheet 186 and one of the plurality of semiconductor chips 116 are situated between the conveying collet 118 and the pushing up needle 119. Then, at step m1, one of the semiconductor chips 116 is accurately positioned on the axis common to the conveying collet 118 and the pushing up needle 119. At step m2, the conveying collet 118 is lowered as shown in FIG. 7B and the pushing up needle 119 ascends, so that the semiconductor chip 116 is pushed upward from the adhesive sheet 186. The semiconductor chip 116 being pushed up is vacuum-sucked by the end surface of the end portion of the conveying collet 118.

At step m3, the conveying collet 118 moves upward while sucking the semiconductor chip 116, so that the semiconductor chip 116 on the side of the adhesive sheet 186 is unstuck and separated upward. Then, at step m4, the semiconductor chip 116 being lifted to a position separated upward from the adhesive sheet 186 is moved in a horizontal direction while being vacuum-sucked by the conveying collet 118, and as shown in FIG. 7C, is accurately positioned immediately above the chip substrate 102 where the brazing filler metal 124 is placed. Under this condition, the conveying collet 118 is lowered at step m5, and after the semiconductor chip 116 is placed on the brazing filler metal 124 on the chip substrate 102, the process proceeds to step n1, where the pressure-reducing source 122 releases the suction and the conveying collet 118 ascends so as to return to the returned position shown in FIG. 7A. When die bonding of all the semiconductor chips 116 has been finished at step m6, die bonding is finished. When die bonding has not been finished, steps m2 to m5 are again executed.

Figure 8A:
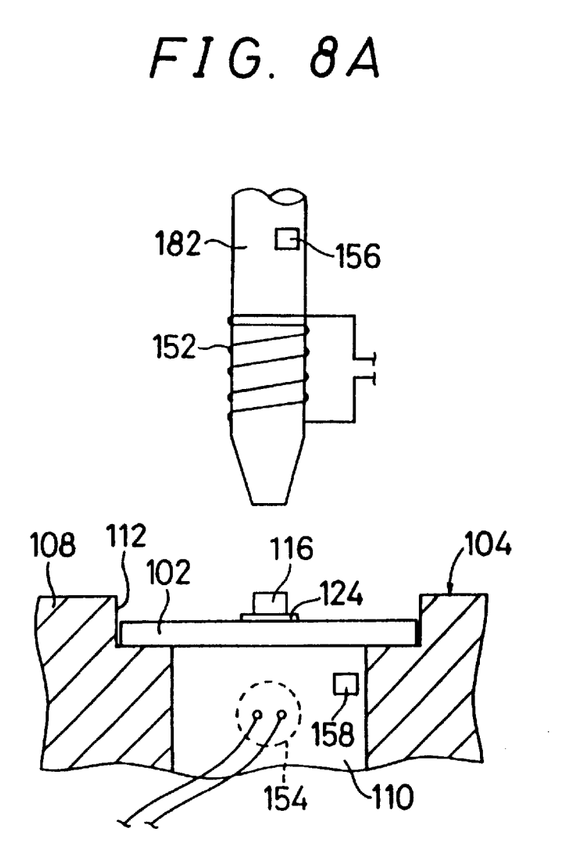
FIGS. 8A and 8B are simplified views of assistance in explaining operation of a pressing member 182, FIG. 8A showing a condition in which the pressing member 182 is situated in a lowering start position and FIG. 8B showing a condition in which the pressing member 182 is pressing the semiconductor chip 116.
Figure 8B:
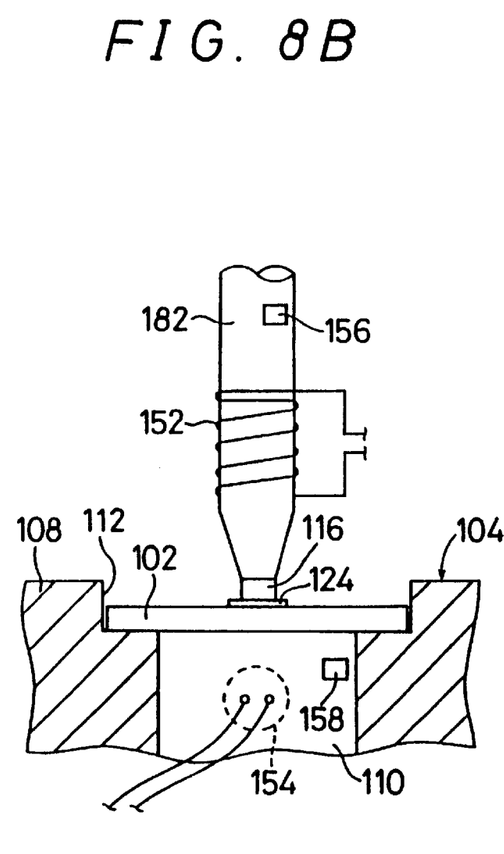

FIGS. 8A and 8B are simplified views of assistance in explaining the operation of the pressing member 182. FIG. 8A shows a condition in which the pressing member 182 is situated in a lowering start position. FIG. 8B shows a condition in which the pressing member 182 is pressing the semiconductor chip 116. When the semiconductor chip 116 is accurately positioned on the brazing filler metal 124 on the chip substrate 102 by the conveying collet 118 as described above, the pressing member 182 starts to be lowered at step n1. At this time, the temperature is always held constant since the first heater 152 is provided on the pressing member 182 and the temperature is controlled by the controlling means 132.

Such a pressing member 182 is lowered at step n2 and presses the semiconductor chip 116 placed on the chip substrate 102 with the brazing filler metal 124 in between as shown in FIG. 8B and heats the semiconductor chip 116. At this time, since the temperatures of the chip substrate 102 and the brazing filler metal 124 are increased to appropriate constant temperatures by the second heater 154 before the semiconductor chip 116 is conveyed onto the chip substrate 102 as shown in FIGS. 7A to 7C, the semiconductor chip 116 is heated to a desired temperature in a short time and the brazing filler metal 124 can surely be melted. As the brazing filler metal 124, for example, a gold antimony foil is used. The chip substrate 102 is a metal stem or lead. The semiconductor chip 116 is, for information, a plate-form member having a rectangular shape with sides of 0.4 to 1 mm and with a thickness of approximately 0.1 to 0.2 mm, and is, for example, an NPN transistor.

What is claimed is:
1. A die bonding apparatus comprising:

a substrate holder for holding a chip substrate;

pressing means for pressing a semiconductor chip on the chip substrate held by the substrate holder;

heating means for heat-melting a brazing filler metal interposed between the chip substrate and the semiconductor chip;

said heating means being disposed in the substrate holder;

a temperature sensor for detecting a surface temperature of the pressing means, the temperature sensor comprising a first temperature sensor provided in the pressing means and a second temperature sensor provided in the substrate holder; and controlling means for controlling a heating operation of the heating means based on a temperature detected by the temperature sensor.

2. A die bonding apparatus comprising:

a substrate holder for holding a chip substrate;

pressing means for pressing a semiconductor chip on the chip substrate held by the substrate holder;

heating means for heat-melting a brazing filler metal interposed between the chip substrate and the semiconductor chip;

a temperature sensor provided at least in the pressing means, for detecting a surface temperature of the pressing means; and controlling means for controlling a heating operation of the heating means based on a temperature detected by the temperature sensor;

wherein the heating means comprises a first heater provided in the pressing means and a second heater provided in the substrate holder, the temperature sensor comprising a first temperature sensor provided in the pressing means and a second temperature sensor provided in the substrate holder, and the controlling means controls a heating operation of the first heater based on a temperature detected by the first temperature sensor and controls a heating operation of the second heater based on a temperature detected by the second temperature sensor.

3. The die bonding apparatus of claim 1, wherein the pressing means conveys, places and presses the semiconductor chip onto the chip substrate, and carries out the semiconductor chip which has been bonded to the chip substrate, from the substrate holder together with the chip substrate.

4. The die bonding apparatus of claim 2, wherein the pressing means conveys, places and presses the semiconductor chip onto the chip substrate, and carries out the semiconductor chip which has been bonded to the chip substrate, from the substrate holder together with the chip substrate.

5. The die bonding apparatus of claim 1, wherein means for conveying and placing the semiconductor chip onto the chip substrate is provided separately from the pressing means.

6. The die bonding apparatus of claim 2, wherein means for conveying and placing the semiconductor chip onto the chip substrate is provided separately from the pressing means.

* * * * *